US006952031B2

United States Patent
Yamauchi (10) Patent No.: US 6,952,031 B2
(45) Date of Patent: Oct. 4, 2005

(54) NONVOLATILE SEMICONDUCTOR MEMORY AND METHOD OF OPERATING THE SAME

(75) Inventor: Yoshimitsu Yamauchi, Nabari (JP)

(73) Assignee: Sharp Kabushiki Kaisha, Osaka (JP)

( * ) Notice: Subject to any disclaimer, the term of this patent is extended or adjusted under 35 U.S.C. 154(b) by 50 days.

(21) Appl. No.: 10/314,021

(22) Filed: Dec. 9, 2002

(65) Prior Publication Data

US 2004/0109355 A1 Jun. 10, 2004

(30) Foreign Application Priority Data

Dec. 10, 2001 (JP) ........................................ 2001-375993

(51) Int. Cl.$^7$ .............................................. H01L 29/76
(52) U.S. Cl. ........................ 257/314; 257/288; 257/315; 257/316
(58) Field of Search ................................. 257/314, 315, 257/316, 288

(56) References Cited

U.S. PATENT DOCUMENTS 6,034,894 A * 3/2000 Maruyama et al. .... 365/185.17

2003/0117845 A1 6/2003 Yamauchi
2003/0124803 A1 7/2003 Ueda et al.

FOREIGN PATENT DOCUMENTS

| JP | 11-054732 | 2/1999 |
| JP | 2001-284555 | 10/2001 |

OTHER PUBLICATIONS

Kume et al; A 1.28m2 Contactless Memory Cell Technology for a 3V–Only 64Mbit EEPROM; IEDM 92, pp. 991–993, 1992.

* cited by examiner

Primary Examiner—David Zarneke
Assistant Examiner—Douglas Menz
(74) Attorney, Agent, or Firm—Nixon & Vanderhye P.C.

(57) ABSTRACT

A nonvolatile semiconductor memory having a memory cell comprises: a semiconductor substrate having a pair of trenches formed on a surface thereof; first electrodes formed in a pair of trenches through the intervention of a first insulating film, respectively; a second electrode formed on the semiconductor substrate between the trenches through the intervention of a second insulating film; and a third electrode formed on the second electrode through the intervention of a third insulating film.

13 Claims, 8 Drawing Sheets

NONVOLATILE SEMICONDUCTOR MEMORY AND METHOD OF OPERATING THE SAME

CROSS-REFERENCE TO RELATED APPLICATION

This application is related to Japanese Patent Application No. 2001-375993 filed on Dec. 10, 2001, whose priority is claimed under 35 USC § 119, the disclosure of which is incorporated by reference in its entirety.

BACKGROUND OF THE INVENTION

1. Field of the Invention

The present invention relates to a nonvolatile semiconductor memory and a method of operating the same. More specifically, it relates to a nonvolatile semiconductor memory including contactless cells which allows high integration and a method of operating the same.

2. Description of Related Art

As means of reducing the memory cell size of nonvolatile semiconductor memories, a contactless array has been used. This array does not require contact between bit lines and drain diffusion layers, which allows easy cell designing (scaling) and is adequate for mass storage.

Figure 15:
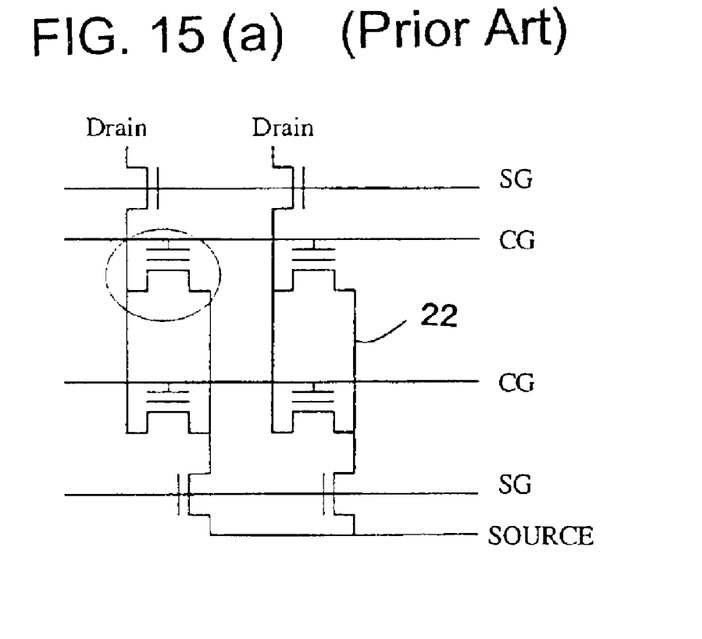
FIGS. 15(a) and 15(b) are an equivalent circuit diagram and a schematic sectional view each illustrating a prior art nonvolatile semiconductor memory.

For example, there has been proposed a contactless AND cell as shown in FIGS. 15(a) and 15(b) (IEDM 92, pp.991–993, 1992).

In this cell, a floating gate 24 is formed on a semiconductor substrate 21 through the intervention of a gate insulating film 23 on a channel formed in the semiconductor substrate 21 between high concentration impurity diffusion layers 22. Additionally, a control gate (CG) 26 is formed on the floating gate 24 through the intervention of an insulating film 25. The high concentration impurity diffusion layers 22 function not only as source/drain regions but also as bit lines.

In the above-described cell, reduction of resistance is necessary to use the high impurity diffusion layers 22 as the bit lines. In general, ions such as phosphorus or arsenic as impurities are implanted at high concentration and heat treatment is performed at 750° C. or higher to activate the high concentration impurity diffusion layers 22.

By the heat treatment, however, the impurities are diffused also in a lateral direction, which increases overlap length between the floating gate 24 and the high concentration impurity diffusion layers 22 as shown in FIG. 15(b). As a result, adjustment of the overlap length becomes difficult.

Moreover, if the cell miniaturization is attempted, the overlap length between the floating gate 24 and the high concentration impurity diffusion layer 22 is an unnegligible factor to ensure effective channel length L for preventing a so-called short channel effect. Therefore, in adjusting gate length M, the adjustment of the overlap length between the floating gate and the high concentration impurity diffusion layer 22 plays an important roll for the cell miniaturization.

SUMMARY OF THE INVENTION

According to the present invention, there is provided a nonvolatile semiconductor memory having a memory cell comprising: a semiconductor substrate having a pair of trenches formed on a surface thereof; first electrodes formed in a pair of trenches through the intervention of a first insulating film, respectively; a second electrode formed on the semiconductor substrate between the trenches through the intervention of a second insulating film; and a third electrode formed on the second electrode through the intervention of a third insulating film.

Still according to the present invention, there are provided a method of reading a nonvolatile semiconductor memory having a memory cell comprising: a semiconductor substrate having a pair of trenches formed on a surface thereof; first electrodes formed in a pair of trenches through the intervention of a first insulating film to form selective transistors, respectively; a second electrode formed on the semiconductor substrate between the trenches through the intervention of a second insulating film; and a third electrode formed on the second electrode through the intervention of a third insulating film, wherein a voltage higher than a threshold value of the selective transistors is applied to the first electrodes, respectively, to change the two selective transistors into the ON state, thereby reading the memory cell, and a method of writing a nonvolatile semiconductor memory of the above, wherein a voltage is applied to one of the first electrodes, the voltage being higher than a threshold value of the selective transistor, to change the selective transistor into the ON state and a voltage is applied to another first electrode, the voltage being lower than a threshold value of the selective transistor, to change the selective transistor into the OFF state, thereby writing the memory cell.

Yet according to the present invention, there is provided a method of writing a nonvolatile semiconductor memory according to claim 11, wherein a writing operation is performed by:

(1) a first step of applying a voltage to the first electrode of the selective transistor connected to the source region, the voltage being lower than a threshold value of the selective transistor, applying a predetermined voltage to the drain regions and applying a voltage to all the first electrodes of the selective transistors connected to the drain regions, the voltage being higher than a threshold value of the selective transistors, to charge a channel region immediately below the second electrode of the memory cell with a drain voltage; and (2) a second step of applying a voltage to the first electrode of the selective transistor connected to the drain region of an unselected memory cell, the voltage being lower than a threshold value of the selective transistor, grounding a drain region connected to a selected memory cell and applying a voltage to the third electrode comprising the selected memory cell, the voltage being higher than a threshold value of the selected memory cell.

DESCRIPTION OF THE PREFERRED EMBODIMENTS

The nonvolatile semiconductor memory according to the present invention includes one or more memory cells comprised of a semiconductor substrate, a first electrode, a second electrode and a third electrode.

The semiconductor substrate is not particularly limited as long as it is generally used in the semiconductor memory. For example, element semiconductor substrates such as those of silicon and germanium, compound semiconductor substrates such as those of GaAs, InGaAs and ZnSe, SOI substrates and multilayer SOI substrates are considered. Among them, a silicon substrate is preferable. The semiconductor substrate preferably includes a device isolation region formed thereon. Further, the semiconductor substrate may be combined with a transistor, a capacitor, elements such as a resistor, an interlayer insulating film, a circuit constituted of them and a semiconductor device to have a single-layer or multilayer structure. The device isolation region may be formed of various device isolation films such as a LOCOS film, a trench oxidation film and an STI film, among which the STI film is preferably used.

The first electrode is formed in a trench formed on the surface of the semiconductor substrate through the intervention of a first insulating film.

The trench may be formed to have a depth of about 2,000 to 5,000 Å, for example.

The first insulating film is not particularly limited. For example, it may be formed of a single-layer or multilayer film, i.e., an insulating film such as a silicon oxide film and a silicon nitride film, or a highly dielectric film such as $TiO_2$ and $Al_2O_3$. The thickness of the first insulating film is suitably about 50 to 300 Å, which may be uniform in the trench or vary at the bottom and the side of the trench. The thickness of the first insulating film at the bottom of the trench may preferably be larger than the thickness at the side of the trench. For example, the thickness may be about 50 to 300 Å at the bottom of the trench and about 100 to 500 Å at the side of the trench. If the first insulating film varies in thickness at the bottom and the side of the trench as described above, the OFF state at the bottom of the trench can easily be ensured when a channel region is formed at the side of the trench by applying a voltage higher than a threshold value of the transistor to the first electrode.

Instead of varying the thickness of the first insulating film at the bottom and the side of the trench, impurities may be doped at an impurity concentration varying in the bottom surface and part of the side surface of the trench to achieve the above-described effect. In this case, the impurity concentration preferably varies in such a manner that regions having different impurity concentrations are arranged to be bilaterally symmetric in a single trench. It may be possible to raise the impurity concentration only on the bottom surface of the trench, in the vicinity of the bottom surface (including the bottom of the side surface) or only on the bottom of the side surface of the trench. In this case, the impurity concentration may suitably vary in the range of about $10^{10}$ to $10^{11}$ cm$^{-3}$ in a lower region and about $10^{17}$ to $10^{19}$ cm$^{-3}$ in a higher region.

The thickness of the first insulating film may be varied by, for example, the following steps. That is, an insulating film is formed on the semiconductor substrate on which the trench has been formed, which is etched back to leave the insulating film only in the trench. Then, the resulting semiconductor substrate is subjected to heat treatment to form a thermal oxide film on the sidewall of the trench, which is thinner than the insulating film on the trench bottom surface.

Further, as means of varying the impurity concentration, there is a method of implanting ions from a vertical direction to the semiconductor substrate on which the trench has been formed while masking the semiconductor substrate surface where the trench has not been formed with an insulating film or photoresist, thereby implanting the impurities in the trench bottom surface only. There is also a method of implanting ions several times at different implantation energy with or without a mask.

In a single memory cell, two first electrodes are formed, i.e., in a pair. These first electrodes function as so-called selective gates and form so-called selective transistors together with the first insulating film.

One of the first electrode pair (the first electrode transistors) is preferably connected to the source region, while the other is preferably connected to the drain region.

If more than one memory cell is formed, the first electrodes of the memory cells are preferably connected along the Y direction.

Further, if more than one memory cell is formed, two memory cells adjacent in the X direction preferably share one of the first electrodes (the first electrode transistors) and the shared first electrode (the first electrode transistor) is preferably connected to the source region.

If more than one memory cell is formed and two memory cells adjacent in the X direction share one of the first electrodes, the other first electrodes (the first electrode transistors) of the memory cells are connected to the drain regions. The first electrodes connected to the drain regions may be electrically connected such that the same voltage is applied to all of them, may be electrically isolated such that different voltages are applied to all of them, or may be electrically connected or isolated such that the same or different voltages are applied to several groups of the first electrodes. In any cases, a device isolation region is preferably formed between adjacent first electrodes connected to the drain regions.

The first electrode may be a single-layer or multilayer made of element semiconductors (e.g., silicon and germanium) or compound semiconductors (e.g., GaAs, InP, ZnSe and CsS) which are N type or P type and amorphous, monocrystalline or polycrystalline; metals such as gold, platinum, silver, copper and aluminum; refractory metals such as titanium, tantalum and tungsten; or silicide or polycide with refractory metals. Among them, polycrystalline silicon is preferably used. The thickness of the first electrode may suitably be adjusted depending on the depth of the trench and the thickness of the first insulating film. For example, about 500 to 2,000 Å is considered.

The second electrode is formed on the semiconductor substrate between the trenches through the intervention of the second insulating film. The second electrode functions as a so-called floating gate. Material and thickness of the second insulating film may be identical with those of the first insulating film. Material of the second electrode may be identical with that of the first electrode and the thickness thereof is suitably about 50 to 150 nm, for example.

The third electrode is formed on the second electrode through the intervention of the third insulating film. The third electrode functions as a so-called control gate. Material and thickness of the third insulating film may be identical with those of the first insulating film. Preferably, the third insulating film is made of an ONO film having a thickness of about 100 to 200 nm in terms of oxide film. The third electrode may be formed of the same material as that of the first electrode and the thickness thereof is suitably about 100 to 300 nm, for example.

If more than one memory cell is formed, the third electrode is preferably connected with the memory cells arranged in the X direction.

A method of operating the semiconductor memory of the present invention will be described in detail by way of the following embodiments. However, voltages to be applied are not limited to those exemplified hereinbelow and any voltage values can be considered as long as the operations performed upon application of the voltages mentioned below are realized.

Hereinafter, embodiments of the nonvolatile semiconductor memory and a method of operating the same are described with reference to the drawings.

Embodiment 1: Unit Memory Cell

FIGS. 1(a), 1(b), 1(c) and 2 illustrate a unit memory cell of the nonvolatile semiconductor memory according to the present invention.

Figure 1:
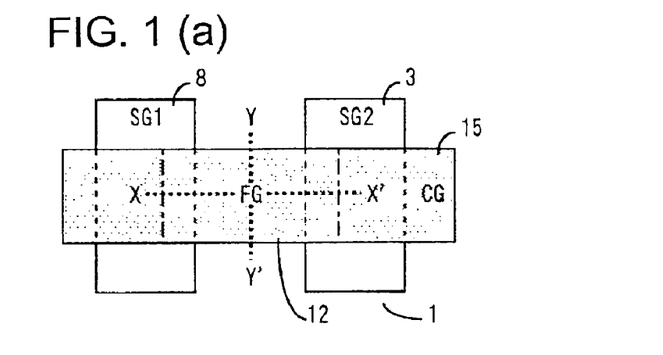
FIG. 1(a) is a schematic plan view and FIGS. 1(b) and 1(c) are schematic sectional views each illustrating an embodiment of a nonvolatile semiconductor memory according to the present invention.

As shown in FIGS. 1(a) to 1(c), the memory cell includes a P-type silicon substrate 1, on which trenches are formed. Selective gates 8 (SG1 and SG2) made of polysilicon are buried in the trenches through the intervention of a trench selective gate oxide film 6 formed over the bottom surface and the sidewall surface of the trenches. Further, a floating gate 12 (FG) made of polysilicon is formed on a flat surface of the silicon substrate 1 between the trenches through the intervention of a tunnel insulating film 10, on which an ONO film 14 and a control gate 15 (CG) are formed in this order.

Figure 2:
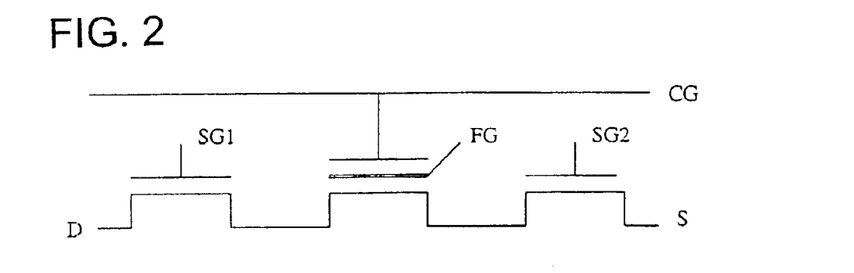
FIG. 2 is an equivalent circuit diagram of the nonvolatile semiconductor memory of FIG. 1.

As shown in FIG. 2, one end of the memory cell is connected to a drain via the selective gate (SG1), while the other end is connected to a source via the selective gate (SG2).

A method of operating the unit memory cell is explained with reference to Table 1.

TABLE 1

|  | SG1 | SG2 | D | S | CG |
| --- | --- | --- | --- | --- | --- |
| Reading | 3 V | 3 V | 1 V | 0 | 4 V |
| Writing | 4 V | 0 | 0/4 V | 0 | 20 V |
| Erasing | 0 | 0 | 0 | 0 | −20 V |

At reading, a voltage of 3V, which is higher than a threshold voltage of the selective gates SG1 and SG2, is applied to the selective gates SG1 and SG2 to put them into the ON state. By applying 1V to the drain, grounding the source and applying 4V to the control gate, the OFF state is established if a threshold voltage of the transistor below the control gate is 4V or higher, while the ON state is established if the threshold voltage is 4V or lower.

At erasing, the source, the drain and the selective gates SG1 and SG2 are grounded and a negative high voltage of −20V is applied to the control gate. Thereby, electrons are extracted from the floating gate to the semiconductor substrate, which decreases a threshold value of the memory cell to perform erasing.

At writing, 4V is applied to the selective gate SG1 on the drain side and the selective gate SG2 on the source side and the source are grounded. By grounding the drain of a selected cell, applying 4V to the drain of an unselected cell and applying 20V to the control gate, a selective Tr of the selected cell enters the ON state, high electric field is applied to the tunnel oxide film and electrons are injected from the semiconductor substrate to the floating gate, thereby increasing the threshold value of the selected cell. On the other hand, in the unselected cell, the selective Tr enters the OFF state and a depletion layer formed on the semiconductor substrate surface in the tunnel region is changed into the floating state. In this case, electric field applied to the tunnel oxide film is low and electron injection does not occur, thereby the threshold value is not changed. Writing is performed by the above-described voltage application.

Embodiment 2: Memory Cell Array

FIGS. 3(a), 3(b), 3(c) and 4 illustrate a memory cell array of the nonvolatile semiconductor memory according to the present invention.

Figure 3:
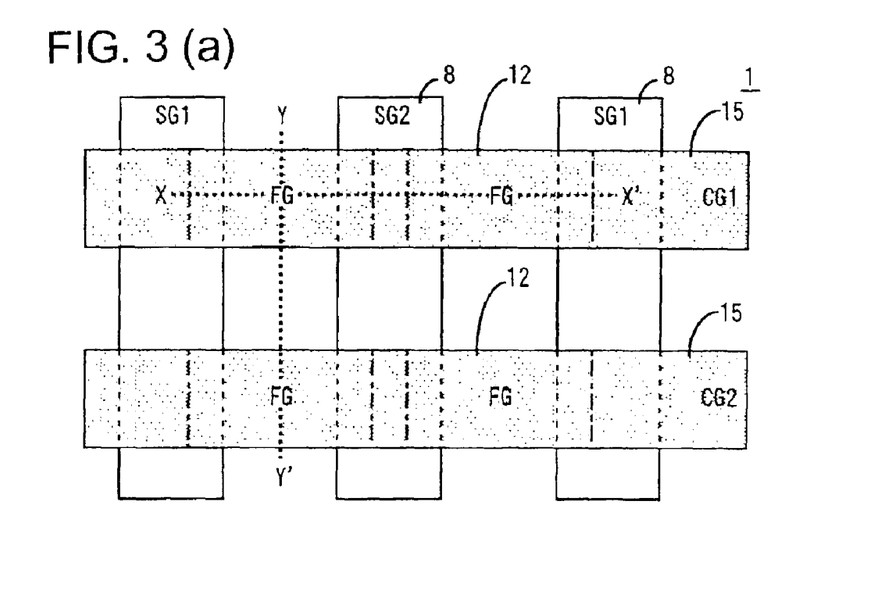
FIG. 3(a) is a schematic plan view and FIGS. 3(b) and 3(c) are schematic sectional views each illustrating another embodiment of the nonvolatile semiconductor memory according to the present invention.

As shown in FIGS. 3(a) to 3(c), the memory cell array includes a plurality of unit memory cells as shown in FIGS. 1(a) to 1(c), in which a selective gate 8 (SG2) is shared between two memory cells adjacent in the X direction and control gates 15 (CG1 and CG2) are connected with a plurality of memory cells arranged in the X direction.

Figure 4:
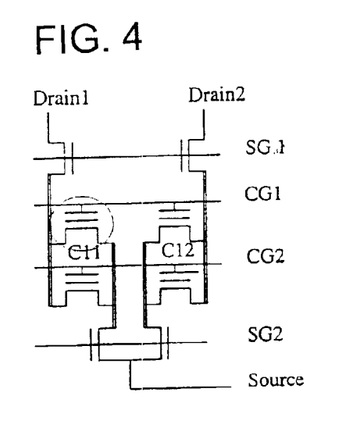
FIG. 4 is an equivalent circuit diagram of the nonvolatile semiconductor memory of FIG. 3.

Further, referring to FIG. 4, even if gate voltages of the selective gates 8 (SG1) are set at the same potential, different drain voltages can be applied to the memory cells. A double line in FIG. 4 indicates a channel of the transistor.

A method of operating the memory cells is explained with reference to Table 2.

TABLE 2

|  | Reading | Writing | Erasing |
| --- | --- | --- | --- |
| SG1 | 3 V | 4 V | 0 |
| SG2 | 3 V | 0 | 0 |
| D1 | 1 V | 0 | Floating |
| D2 | 0 | 4 V | Floating |
| CG1 | 4 V | 20 V | −20 V |
| CG2 | 0 | 0 | 0 |
| S | 0 | 0 | 0 |

In this embodiment, reference is made to a memory cell array including two lines and two columns for easy explanation. C11 is a selected sell.

At reading, a voltage of 3V, which is higher than a threshold voltage of the selective gates SG1 and SG2, is applied to the selective gates SG1 and SG2 to put them into the ON state. When a voltage of 1V is applied to the drain 1 of the selected cell C11 (0V to the drain 2), the source is grounded and 4V is applied to the control gate CG1 (0V to CG2), the state is shifted to ON if the threshold value of the cell is lower than 4V (erasing state), while the state is shifted to OFF if the threshold value of the cell is higher than 4V (writing state). Thereby, the state of the selected cell C11 is read out.

At erasing, a high negative voltage of −20V is applied to the control gate (0V to SG1, SG2, CG2 and the source, the drains 1 and 2 are open) to extract electrons from the floating gate to the semiconductor substrate, which decreases the threshold value of the cell. Thereby, erasing is performed line by line.

At writing, the drain 1 of the selected cell C11 is grounded, 4V is applied to the drain 2 of the unselected cell and 4V is applied to the selective gate (SG1). At this time, the selective gate (SG2) is grounded to stay in the OFF state. Under the biasing condition, a high voltage of 20V is applied to the control gate (CG1) of the selected cell, thereby high electric field is applied to the tunnel oxide film of only the selected cell C11 and electrons are injected from the substrate to the floating gate. Thus, the threshold value is shifted higher. Writing is performed by the above-described voltage application.

Embodiment 3: Memory Cell Array

This memory cell array includes a plurality of unit cells as shown in FIGS. 3(a) to 3(c) and FIG. 5, in which two memory cells adjacent in the X direction share a selective gate 8 (SG2) and control gates 15 (CG1 and CG2) are connected with a plurality of memory cells arranged in the X direction. Further, a device isolation region is formed between adjacent selective gates connected to the drain to provide electrical isolation between columns.

Figure 5:
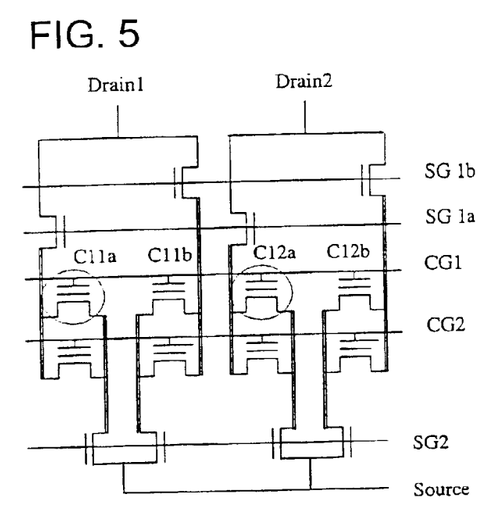
FIG. 5 is an equivalent circuit diagram illustrating still another embodiment of the nonvolatile semiconductor memory according to the present invention.

Moreover, the drain is shared between adjacent memory cells to apply different selective gate voltages (SG1: divided into SG1a and SG1b) as shown in FIG. 5. A double line in FIG. 5 indicates a channel of the transistor.

A method of operating the memory cell array is explained with reference to Table 3.

TABLE 3

|  | Reading | Writing | Erasing |
| --- | --- | --- | --- |
| SG1a | 3 V | 6 V | 0 |
| SG1b | 0 | 6 V → 0 V | 0 |
| SG2 | 3 V | 0 | 0 |
| D1 | 1 V | 4 V → 0 | Floating |
| D2 | 1 V | 4 V → 4 V | Floating |
| CG1 | 4 V | 6 V → 20 V | −20 V |
| CG2 | 0 | 6 V | 0 |
| S | 0 | 0 | 0 |

At reading, a voltage of 3V, which is higher than a threshold voltage of the selected gates SG1a and SG2, is applied to the selective gates SG1a and SG2 to put them into the ON state. When a voltage of 1V is applied to the drains of the selected cells C11a and C12a (1V to drains 1 and 2), the source is grounded and 4V is applied to the control gate CG1 (0V to CG2), the ON state is established if the threshold voltage of the cell is 4V or lower, while the OFF state is established if the threshold voltage is 4V or higher. Thereby, data is read out of the selected cells C11a and C12a.

At erasing, a negative high voltage of −20 V is applied to the control gate (CG1) while 0V is applied to SG1, SG2, CG1 and the source, and the drains 1 and 2 are opened. Thereby, electrons are extracted from the floating gate to the semiconductor substrate, which decreases the threshold voltage of the cell. Thus, erasing is performed line by line.

At writing, the selective gate (SG2) is grounded at all times to enter the OFF state and writing is performed by the following two steps. Though FIG. 5 shows 2 page cells C11a and C11b on a single control gate, explanation is given to the case where data is written in the C11a cell.

In step 1, 6V is applied to the selective gates SG1 (SG1a and SG1b) of both cells, 4V is applied to the drains 1 and 2, and 6V is applied to the control gates (CG1 and CG2) to charge the cell channel to about 4V.

In step 2, the selective gate SG1b connected to the unselected page cells (C11b and C12b) is grounded. Then, in the selected page cells (C11a and C12a), the drain 1 of the selected cells is grounded, the drain 2 of the unselected cells is kept at 4V and then a voltage at the control gate (CG1) of the selected cell (C11a) is raised to 20V. At this time, high electric field is applied only to the tunnel oxide film of the selected cell (C11a), electrons are injected from the substrate to the floating gate, thereby the threshold voltage of the cell increases. On the other hand, since the channel region of the unselected cell is still charged to about 4V and in the floating state, electric field applied to the tunnel oxide film is low and electrons are not given or taken through the tunnel oxide film, which keeps the threshold voltage low. Thus, writing is performed bit by bit to the selected cell (C11a).

Embodiment 4: Manufacturing Method

Figure 6:
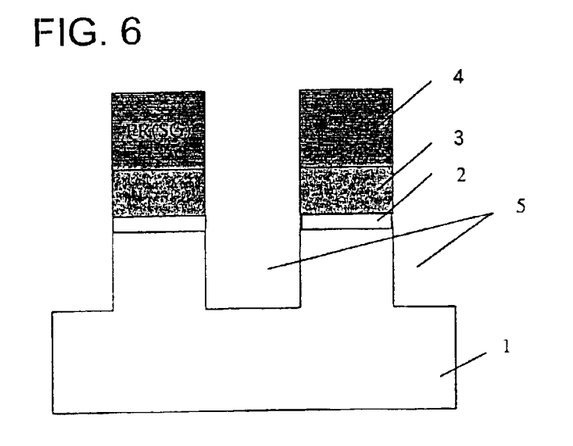
FIG. 6 is a schematic sectional view of a major part illustrating the steps of a method of manufacturing the nonvolatile semiconductor memory according to the present invention.

First, as shown in FIG. 6, an oxide film 2 of 20 nm thick is deposited on a silicon substrate 1 of a first conductivity type by thermal oxidation at 900° C. and a nitride film 3 of 100 nm thick is deposited on the oxide film 2. Using a photoresist 4 having a predetermined shape as a mask, the silicon substrate 1 is etched to form trenches 5 of 300 nm in depth.

Figure 7:
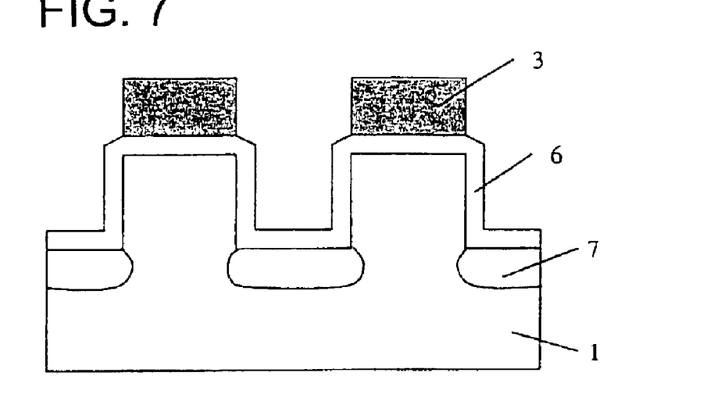
FIG. 7 is a schematic sectional view of a major part illustrating the steps of a method of manufacturing the nonvolatile semiconductor memory according to the present invention.

Then, the photoresist 4 is removed and a trench selective gate oxide film 6 of 20 nm thick is formed in the trenches 5 by thermal oxidation as shown in FIG. 7. To the resulting silicon substrate 1, boron is implanted at an implantation angle of 0° to form a boron impurity diffusion layer 7 only on the bottom of the trenches 5. Thereby, a threshold value at the bottom of the trenches 5 is raised higher than that at the sidewall of the trenches, which provides electrical isolation between the right sidewall and the left sidewall of the trenches.

Figure 8:
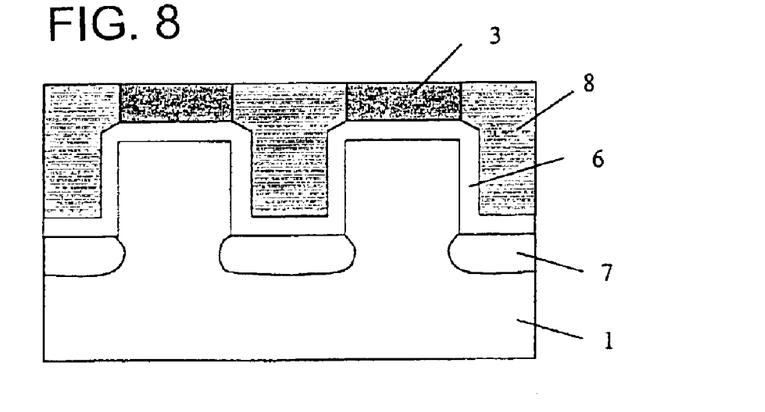
FIG. 8 is a schematic sectional view of a major part illustrating the steps of a method of manufacturing the nonvolatile semiconductor memory according to the present invention.

Then, as shown in FIG. 8, a polysilicon film 8a is deposited to such a thickness that buries the trenches 5, for example, 300 nm, and flattened by CMP until the surface of the nitride film 3 is exposed.

Figure 9:
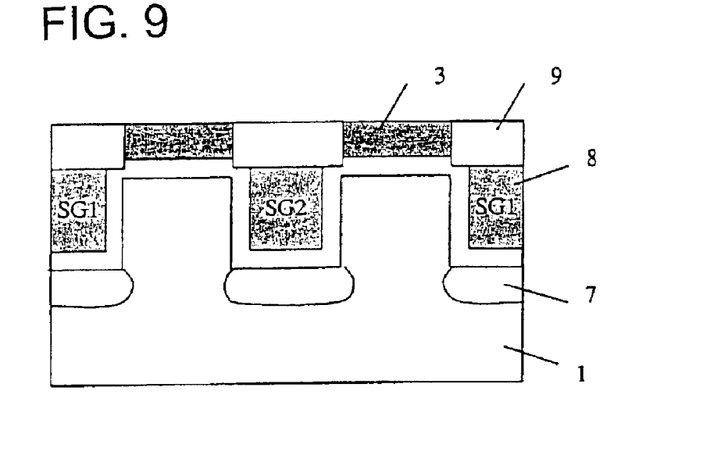
FIG. 9 is a schematic sectional view of a major part illustrating the steps of a method for manufacturing the nonvolatile semiconductor memory according to the present invention.

Then, as shown in FIG. 9, the polysilicon film 8a filled in the trenches 5 is thermally oxidized to form a thermal oxide film 9 on the surface of the polysilicon film 8a and provide a selective gate 8.

Figure 10:
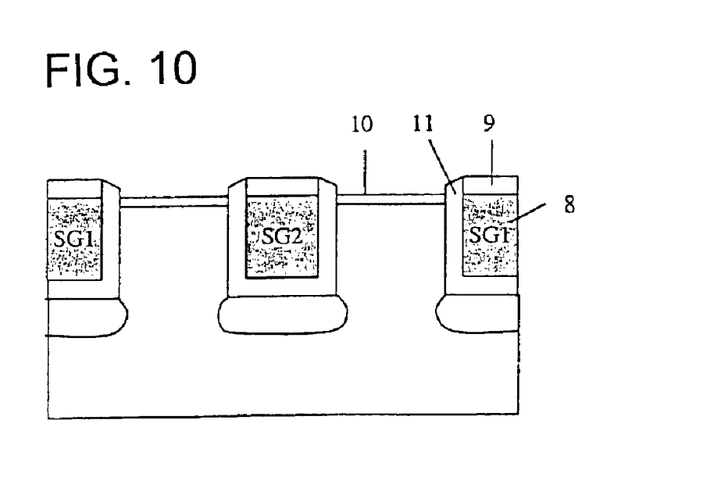
FIG. 10 is a schematic sectional view of a major part illustrating the steps of a method for manufacturing the nonvolatile semiconductor memory according to the present invention.

Further, as shown in FIG. 10, the silicon substrate 1 from which the nitride film 3 and the oxide film 2 are removed is subjected to thermal oxidation at 800° C. to form a tunnel oxide film 10 of 7 nm thick. Thereby, an oxide film 11 of about 14 nm thick and a thermal oxide film 9 are arranged on the side and the top of the polysilicon film, respectively.

Figure 11:
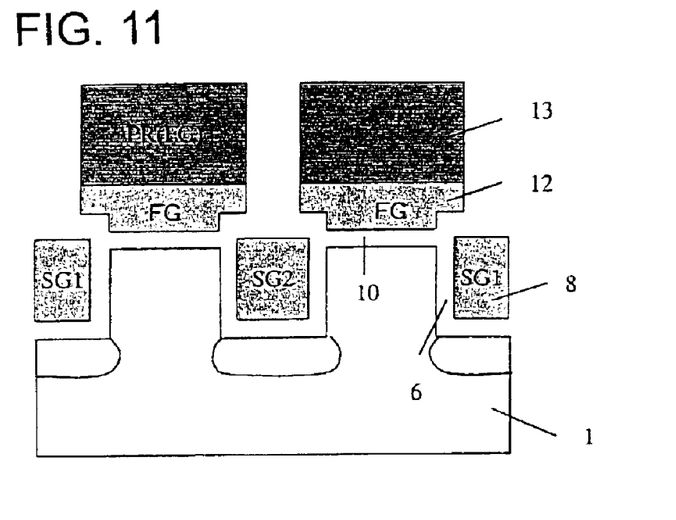
FIG. 11 is a schematic sectional view of a major part illustrating the steps of a method for manufacturing the nonvolatile semiconductor memory according to the present invention.

Then, as shown in FIG. 11, a polysilicon film is deposited on the resulting silicon substrate 1, which is patterned using a photoresist 13 as a mask to form a floating gate (FG) 12.

Figure 12:
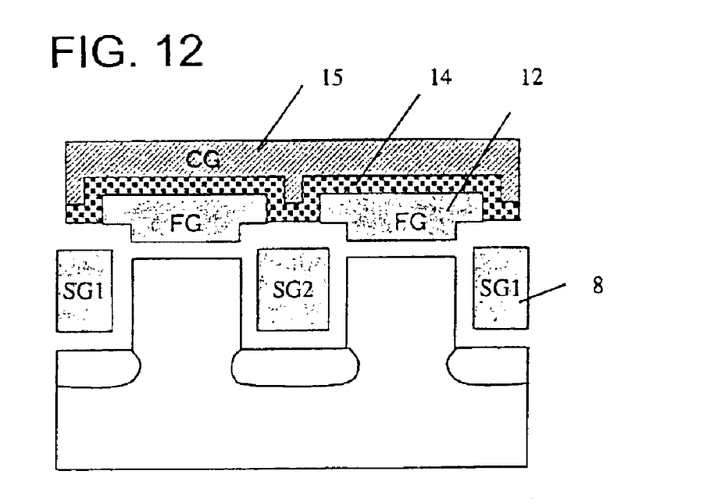
FIG. 12 is a schematic sectional view of a major part illustrating the steps of a method for manufacturing the nonvolatile semiconductor memory according to the present invention.

Finally, as shown in FIG. 12, an ONO film 14 in a thickness corresponding to 14 nm in oxide film conversion and a silicide film are deposited. Then, the silicide film, the ONO film 14 and the floating gate 12 are sequentially etched into the pattern of word lines. Thereby, a control gate 15 is formed in self-alignment and a transistor is obtained.

Embodiment 5: Manufacturing Method

In the same manner as shown in FIG. 6, trenches 5 are formed on the silicon substrate 1.

Figure 13:
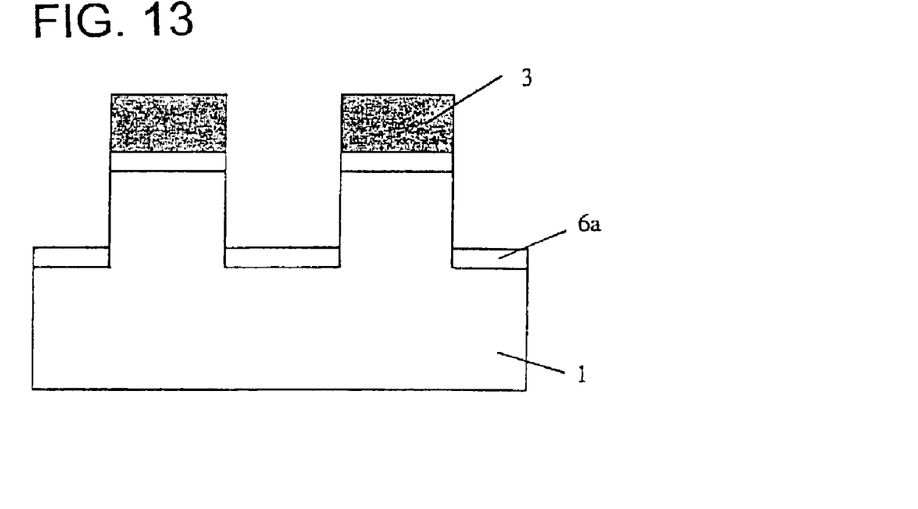
FIG. 13 is a schematic sectional view of a major part illustrating the steps of a method for manufacturing the nonvolatile semiconductor memory according to the present invention.

After the photoresist 4 is removed, an oxide film is formed on the resulting silicon substrate 1, which is etched back to leave an oxide film 6a only on the bottom surface of the trenches as shown in FIG. 13.

Figure 14:
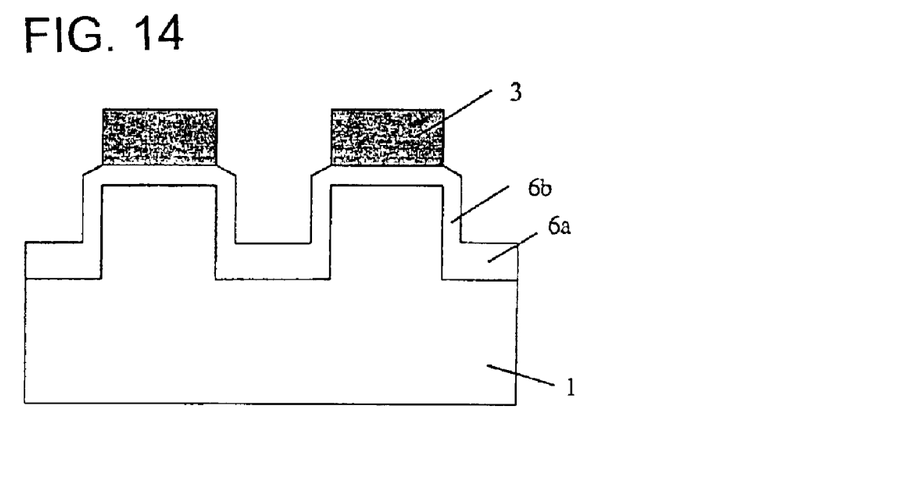
FIG. 14 is a schematic sectional view of a major part illustrating the steps of a method for manufacturing the nonvolatile semiconductor memory according to the present invention.

Then, as shown in FIG. 14, a thermal oxide film 6b, which is thinner than the oxide film 6a on the trench bottom surface, is formed on the sidewall of the trench.

The manufacturing steps hereinafter are identical with those of Embodiment 4.

According to this method, the oxide film 6a on the trench bottom surface is formed to be thicker than the oxide film 6 formed on the sidewall of the trench, which increases the threshold value at the trench bottom surface. Also, the channel regions on the right side and the left side of the trench can be electrically isolated from each other.

According to the present invention, the first electrode is buried in the trench formed on the semiconductor substrate and connected to the source/drain region via the channel region of the selective transistor comprised of the first electrode. This eliminates the need of directly connecting the channel region of the memory cell and the source/drain region which is an impurity diffusion layer. Therefore, there is no overlap between the impurity diffusion layer and the floating gate of the memory cell, which drastically improves the scalability of the gate length. Thereby, a nonvolatile semiconductor memory of mass storage and low bit costs is provided.

Further, writing and erasing to and from the nonvolatile semiconductor memory described above can be performed by means of FN tunneling current and channel hot electrons. Therefore, a nonvolatile semiconductor memory which is highly reliable and writable at high speed is provided.

What is claimed is:

1. A nonvolatile semiconductor memory including a memory cell, the memory cell comprising:
   a semiconductor substrate including a pair of trenches formed on a surface thereof, the pair of trenches spaced apart in an X direction;
   a first electrode formed in each trench through the intervention of a first insulating film;
   a second electrode formed on the semiconductor substrate at least partially between the trenches through the intervention of a second insulating film;
   a third electrode extending in the X direction on the second electrode through the intervention of a third insulating film; and
   wherein in a pair of selective transistors each including the first electrode, one end of one transistor in a Y direction crossing the X direction is connected to a source region through intervention of the first insulating film, and one end of the other transistor in the Y direction is connected to a drain region through the intervention of the first insulating film.

2. A nonvolatile semiconductor memory according to claim 1, wherein the first insulating film varies in thickness at the bottom and the side of the trench.

3. A nonvolatile semiconductor memory according to claim 1, wherein a plurality of the memory cells are arranged in matrix,
   the memory cells arranged in the X direction are connected with the third electrode lying in the X direction,
   the memory cells arranged in the Y direction are connected with the first electrode lying in the Y direction, and
   the memory cells are each connected to a pair of source/drain regions via selective transistors including the first electrodes, respectively, to share the source/drain regions.

4. A nonvolatile semiconductor memory according to claim 3, wherein two memory cells adjacent in the X direction share one of the first electrodes to establish a connection with the source region via the selective transistor comprised of the shared first electrode.

5. A nonvolatile semiconductor memory according to claim 3, wherein all the first electrodes of the selective transistors connected to the source regions are commonly connected.

6. A nonvolatile semiconductor memory according to claim 3, wherein all the first electrodes of the selective transistors connected to the drain regions are commonly connected.

7. A nonvolatile semiconductor memory according to claim 3, wherein the first electrodes of the selective transistors connected to the drain regions are electrically isolated such that different voltages can be applied thereto.

8. A nonvolatile semiconductor memory according to claim 3, wherein a device isolation region is formed between adjacent first electrodes connected to the drain regions via the selective transistors.

9. A nonvolatile semiconductor memory according to claim 3, wherein the source regions are grounded.

10. The memory of claim 1, wherein a bottom of at least one of the trenches is doped differently with an impurity than at least part of a sidewall of the trench, so that the bottom of the trench is more heavily doped with the impurity than is said at least part of the sidewall of the trench which may or may not be doped with the impurity.

11. A nonvolatile semiconductor memory including at least one memory cell comprising:
   a semiconductor substrate including a pair of trenches formed in a surface region thereof;
   selective gate electrodes, of respective selective transistors, respectively formed in the pair of trenches through the intervention of respective first insulating films;
   a floating gate formed on the semiconductor substrate at least partially between the trenches through the intervention of a second insulating film;

a control gate formed on the semiconductor substrate over the floating gate through the intervention of a third insulating film; and wherein an edge portion(s) of the floating gate overlaps one or more of the selective gate electrodes.

12. The memory of claim 11, wherein a bottom of at least one of the trenches is doped differently with an impurity than at least part of a sidewall of the trench, so that the bottom of the trench is more heavily doped with the impurity than is said at least part of the sidewall of the trench which may or may not be doped with the impurity.

13. The memory of claim 1, wherein the first electrode comprises a selective gate, the second electrode comprises a floating gate, and the third electrode comprises a control gate.

* * * * *